(12) United States Patent
Chung et al.

(10) Patent No.: US 7,982,218 B2
(45) Date of Patent: Jul. 19, 2011

(54) TFT ARRAY SUBSTRATE AND METHOD FOR FORMING THE SAME

(75) Inventors: Te-Chen Chung, Kun Shan (CN); Chia-Te Liao, Kun Shan (CN)

(73) Assignee: Infovision Optoelectronics (Kunshan) Co., Ltd., Kunshan (CN)

( * ) Notice: Subject to any disclaimer, the term of this patent is extended or adjusted under 35 U.S.C. 154(b) by 61 days.

(21) Appl. No.: 12/495,819

(22) Filed: Jul. 1, 2009

(65) Prior Publication Data
US 2010/0295048 A1    Nov. 25, 2010

(30) Foreign Application Priority Data
May 19, 2009    (CN) ............ 2009 1 0142964

(51) Int. Cl.
*H01L 29/04* (2006.01)
*H01L 31/036* (2006.01)
*H01L 31/0376* (2006.01)
*H01L 31/20* (2006.01)
*H01L 27/15* (2006.01)
(52) U.S. Cl. ............... 257/59; 257/72; 257/347; 257/79
(58) Field of Classification Search .............. 257/59, 257/57, 72, 347, 350, 351, 291, 443, 292, 257/448
See application file for complete search history.

(56) References Cited

U.S. PATENT DOCUMENTS
5,998,229 A * 12/1999 Lyu et al. ............ 438/30
6,255,668 B1 * 7/2001 Kang et al. ............ 257/59

FOREIGN PATENT DOCUMENTS
CN          1773374 A        5/2006

* cited by examiner

*Primary Examiner* — Chuong A. Luu
(74) *Attorney, Agent, or Firm* — Perkins Coie LLP

(57) ABSTRACT

A TFT array substrate comprises an insulator base; a first metal layer on the insulator base, a first portion thereof forming a gate electrode of a TFT; a gate insulating layer overlying the first metal layer and the insulator base; an amorphous silicon layer and a first layer of conductive transparent material both on the gate insulating layer; a doped amorphous silicon layer positioned on the amorphous silicon layer; a second metal layer on the doped amorphous silicon layer and the first layer of conductive transparent material, a first portion thereof forming source and drain electrodes of the TFT; a passivation layer on the second metal layer; and a second layer of conductive transparent material on the passivation layer, a first portion thereof forming a pixel electrode, wherein the first layer of conductive transparent material forms a portion of a common electrode of the array substrate.

6 Claims, 8 Drawing Sheets

TFT ARRAY SUBSTRATE AND METHOD FOR FORMING THE SAME

FIELD OF THE INVENTION

The present invention relates to a Thin Film Transistor Liquid Crystal Display (TFT-LCD) and in particular to a TFT array substrate in a TFT-LCD and method for forming the same.

BACKGROUND

TFT-LCDs are widely used in the field of flat panel displays for being light, thin and small, as well as having low power consumption, radiation-free emission and low usage cost. The TFT-LCDs are very suitable for desktop computers, palmtop computers, personal digital assistants (PDAs), portable telephones, televisions and various Office Automation and audiovisual devices. A liquid crystal display panel is the main part of the TFT-LCD, and generally comprises a TFT array substrate (also known as an array substrate), a color filter substrate and a liquid crystal layer sandwiched between the TFT array substrate and the color filter substrate.

A conventional array substrate in a TFT-LCD generally comprises a plurality of data lines and a plurality of scan lines, the data lines and the scan lines being arranged to perpendicularly intersect one another to define a plurality of pixel regions. Each of the pixel regions is provided with a pixel electrode therein, and a common electrode is provided in a layer underneath a layer in which the pixel electrodes are provided. A storage capacitor is formed by the pixel electrode and the common electrode being overlapped with an insulating layer disposed therebetween. TFTs are formed near the positions of intersection of the data lines and scan lines, and each comprises a gate electrode, a semiconductor layer, a source electrode and a drain electrode. Typically, the gate electrode is electrically connected with the scan line, the source electrode is electrically connected with the data line, and the drain electrode is electrically connected with the pixel electrode. In a TFT-LCD array substrate, the storage capacitor is for maintaining a potential of the pixel electrode after ending of a pixel scan signal, and increasing the capacitance of the pixel capacitor uniformly can effectively improve the uniformity of picture.

FIG. 1 is a cross section schematically showing a structure of a conventional array substrate 100. The array substrate 100 comprises a base 101', a gate electrode 102' and a common electrode 109 on the base 101', a gate insulating layer 103' above the gate electrode 102' and the common electrode 109, a semiconductor layer 104 on the gate insulating layer 103', a source electrode 105' and a drain electrode 106' of a TFT on the semiconductor layer 104 and the gate insulating layer 103', a passivation layer 107' on the gate insulating layer 103', the source electrode 105' and the drain electrode 106', and a pixel electrode 108 on the passivation layer 107'.

FIG. 2 is a flow chart illustrating a conventional method of manufacturing the array substrate 100. The method employs five mask processes, and principally comprises the following five steps:

a. forming the gate electrode and the common electrode;
   b. forming the gate insulating layer and the semiconductor layer;
   c. forming a metal layer for the source/drain electrode and forming a TFT channel;
   d. forming the passivation layer; and
   e. forming the pixel electrode.

FIG. 3 is a plan view illustrating a pattern of the metal layer after the first mask process of the manufacturing method shown in FIG. 2. A storage capacitor is formed between the formed common electrode 109 (see FIG. 1) and the pixel electrode 108 (see FIG. 1) formed in the later fifth mask process to maintain a potential of the pixel electrode after end of a pixel scan signal.

In a conventional array substrate as shown in FIG. 3, the common electrodes are typically formed in matrix form. As a result, adverse effects, such as crosstalk, and adverse viewing effects, such as flickers and appearance of horizontal white-lines that are introduced due to difference in electrode signals, can be avoided. Although the common electrode in matrix form improves uniformity of signal, the aperture ratio of pixel is reduced because the common electrode 109 is an opaque metal layer.

SUMMARY

A TFT array substrate and a method for forming the same may be provided according to embodiments of the present invention, which can increase the aperture ratio of a pixel and decrease the capacitive coupling between the data line and the pixel electrode, and thus improve the quality of display for a LCD.

In one embodiment, an array substrate is provided having data lines and scan lines, a TFT and a storage capacitor, the data lines and the scan lines being arranged to intersect one another to define pixel regions, the storage capacitor comprising a pixel electrode, a common electrode and an insulator disposed therebetween, the array substrate comprising:

an insulator base;
   a first metal layer on the insulator base, a first portion of the first metal layer forming a gate electrode of the TFT and the scan line electrically connected with the gate electrode;
   a gate insulating layer overlying the first metal layer and the insulator base;
   an amorphous silicon layer and a first layer of conductive transparent material both positioned on the gate insulating layer;
   a doped amorphous silicon layer positioned on the amorphous silicon layer and forming a semiconductor layer of the TFT with the amorphous silicon layer collectively;
   a second metal layer positioned on the doped amorphous silicon layer and the first layer of conductive transparent material, a first portion of the second metal layer forming a source electrode and a drain electrode of the TFT, the source electrode being electrically connected with the data line;
   a passivation layer on the second metal layer acting as the insulator; and
   a second layer of conductive transparent material on the passivation layer, a first portion of the second layer of conductive transparent material forming the pixel electrode, the pixel electrode being electrically connected with the drain electrode,
   wherein the first layer of conductive transparent material forms a portion of the common electrode.

In another embodiment, a method of forming a TFT array substrate is provided. The TFT array substrate has data lines and scan lines, a TFT and a storage capacitor, the data lines and the scan lines being arranged to intersect one another to define pixel regions, the storage capacitor comprising a pixel electrode, a common electrode and an insulator disposed therebetween. The method comprises:

a) forming a first metal layer on an insulator base, and patterning the first metal layer to form a gate electrode of the TFT and the scan line;

b) forming a gate insulating layer, an amorphous silicon layer and a doped amorphous silicon layer on the array substrate sequentially, and patterning the doped amorphous silicon layer and the amorphous silicon layer to form a semiconductor layer of the TFT;

c) forming a first layer of conductive transparent material on the array substrate;

d) forming a second metal layer on the array substrate, patterning the second metal layer to form a source electrode and a drain electrode of the TFT, and removing a portion of the first conductive transparent layer that is not covered by the patterned second metal layer;

e) removing partially the second metal layer to expose the first layer of conductive transparent material beneath, the exposed portion of the first layer of conductive transparent material forming a portion of the common electrode;

f) depositing a passivation layer on the array substrate and patterning the passivation layer to form a third through-hole through which the drain electrode is exposed; and g) forming a second layer of conductive transparent material on the array substrate, and patterning the second layer of conductive transparent material to form the pixel electrode electrically connected to the drain electrode.

According to embodiments of the invention, the aperture ratio of a pixel can be increased without decreasing the capacitance of the storage capacitor, and the capacitive coupling between the data line and the pixel electrode can be reduced. As a result, the quality of display for LCD can be improved.

DETAILED DESCRIPTION OF EMBODIMENTS

Exemplary embodiments will be described in detail in the following with reference to the drawings.

A TFT array substrate according to an embodiment of the invention comprises a plurality of data lines and a plurality of scan lines, the data lines and the scan lines being arranged to perpendicularly intersect one another to define a plurality of pixel regions. For each of the pixel regions, a storage capacitor is formed in a manner in which a pixel electrode and a common electrode are overlapped with one another and an insulator is disposed therebetween. Each pixel region is controlled by a TFT comprising a gate electrode, a semiconductor layer, a source electrode and a drain electrode. The gate electrode may be electrically connected with the scan line, the source electrode may be electrically connected with the data line, and the drain electrode may be electrically connected with the pixel electrode. It is noted that in the present application, the expression analogous to "A is electrically connected with B" intends to also cover the situations of "A is the same element as B", "A is a portion of B" or "B is a portion of A".

Figure 4A:
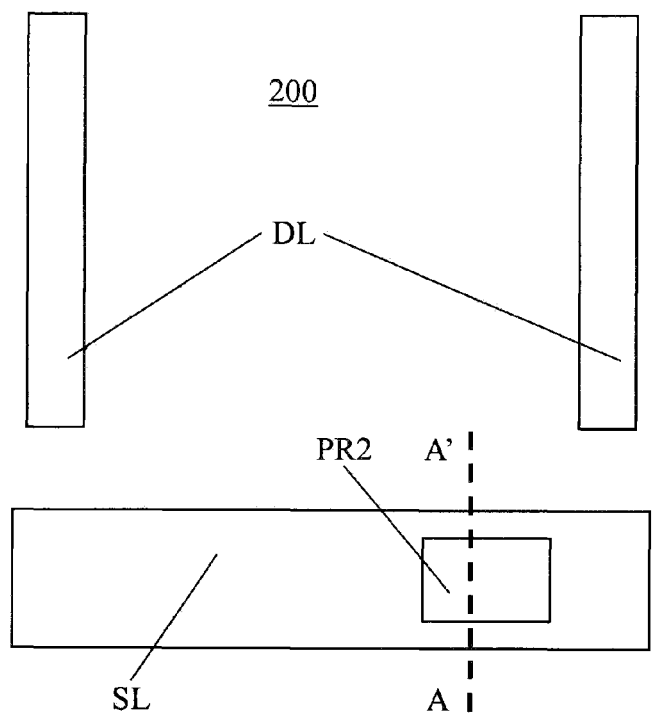
FIG. 4(a) is a partial plan view illustrating an array substrate after a first and a second mask processes according to an embodiment of the invention.
Figure 4B:
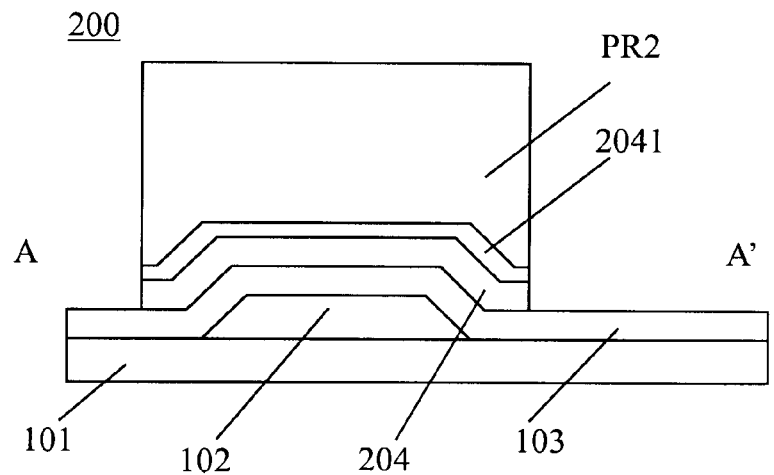
FIG. 4(b) is a partial section view illustrating the array substrate taken along the A-A' line of FIG. 4(a)
Figure 4C:
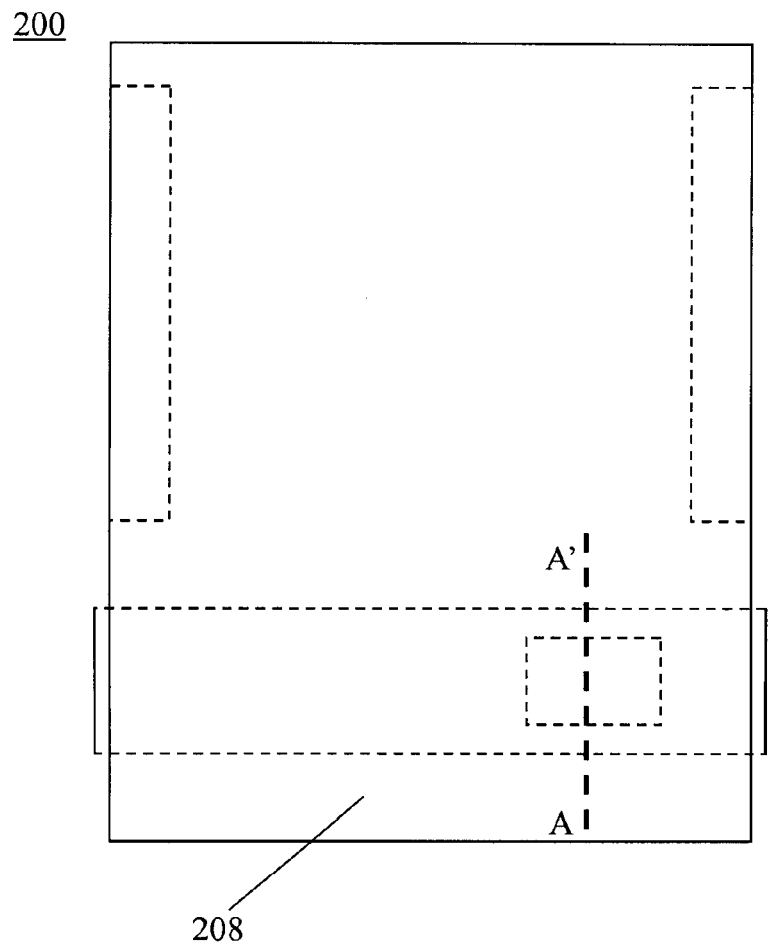
FIG. 4(c) is a partial plan view illustrating the array substrate after depositing a first Indium Tin Oxide (ITO) layer.
Figure 4D:
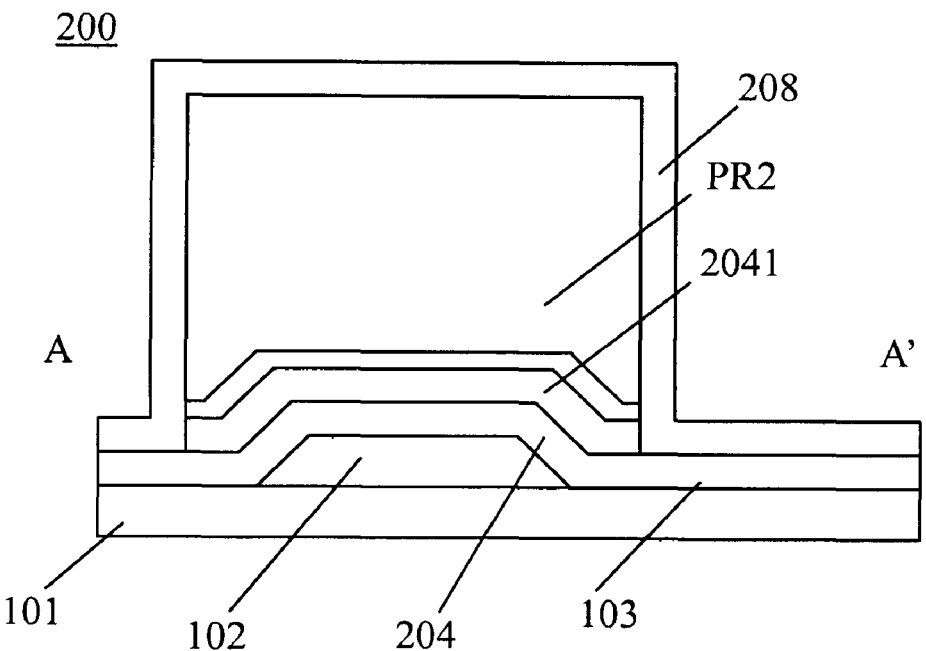
FIG. 4(d) is a partial section view illustrating the array substrate taken along the A-A' line of FIG. 4 (c)
Figure 4E:
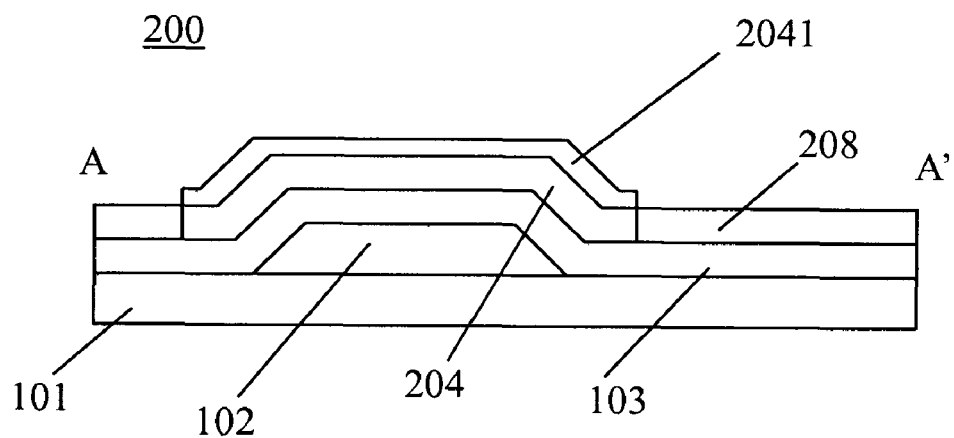
FIG. 4(e) is a partial section view illustrating the array substrate after a photoresist lift-off process.
Figure 4F:
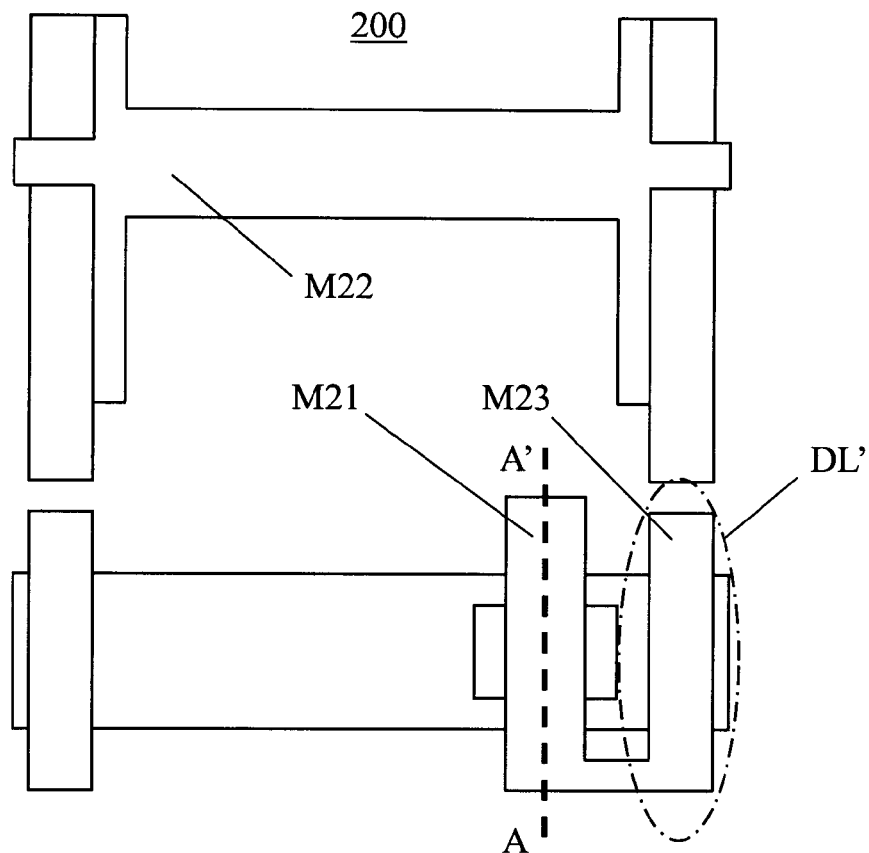
FIG. 4(f) is a partial plan view illustrating the array substrate after a third mask process.
Figure 4G:
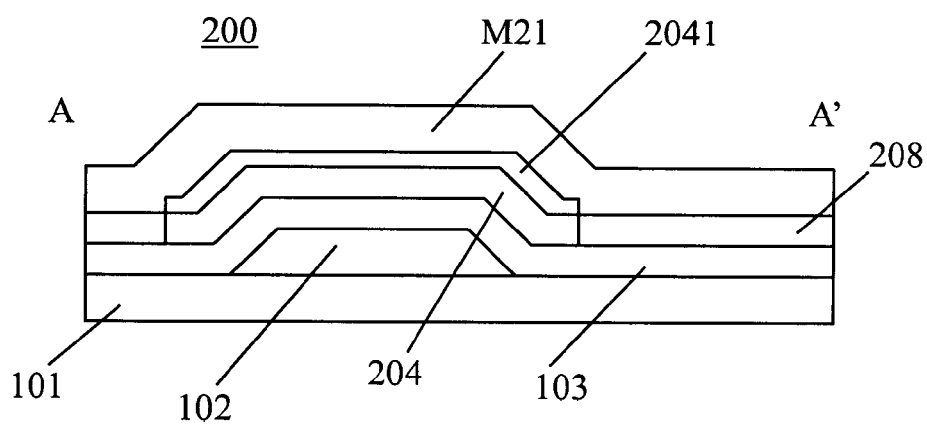
FIG. 4(g) is a partial section view illustrating the array substrate taken along the A-A' line of FIG. 4(f)
Figure 4H:
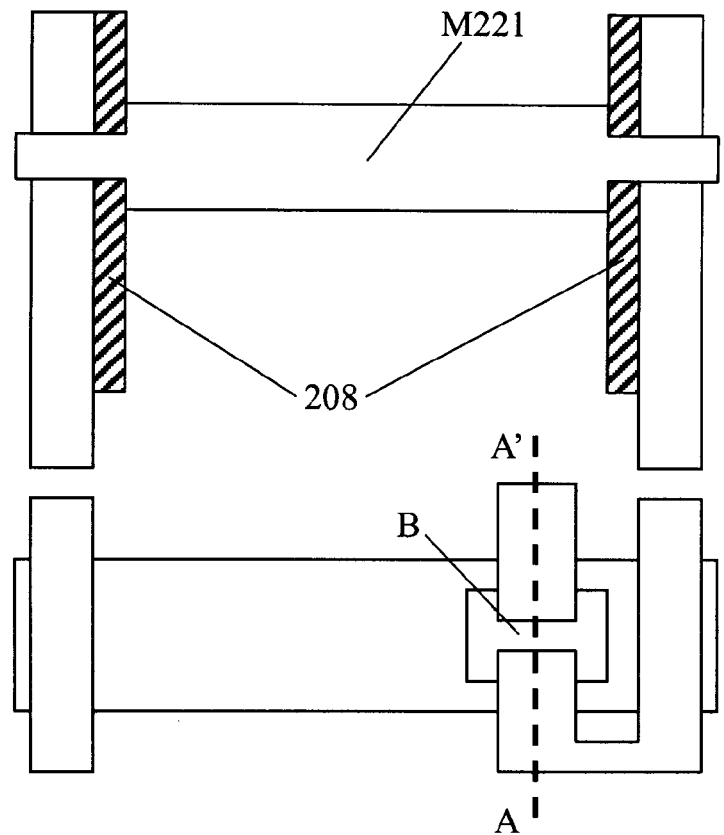
FIG. 4(h) is a partial plan view illustrating the array substrate after the TFT channel being formed and the third photoresist layer being removed.
Figure 4I:
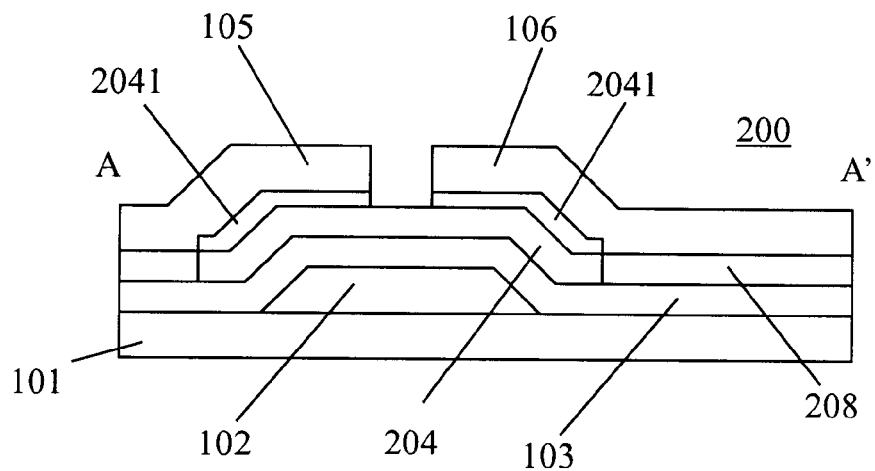
FIG. 4(i) is a partial section view illustrating the array substrate taken along the A-A' line of FIG. 4(h)
Figure 4J:
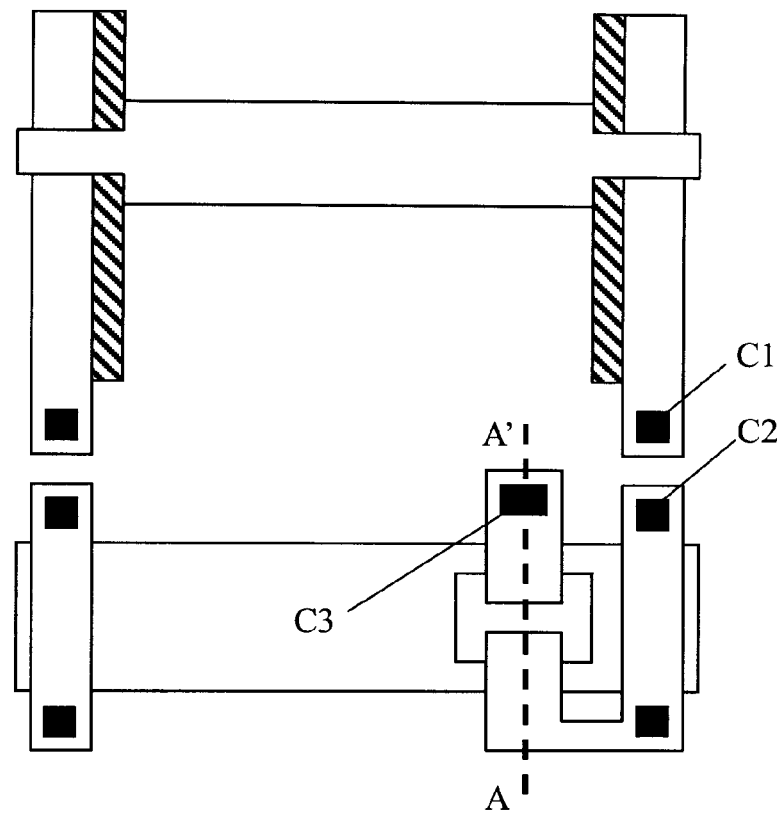
FIG. 4(j) is a partial plan view illustrating the array substrate after a fourth mask process.
Figure 4K:
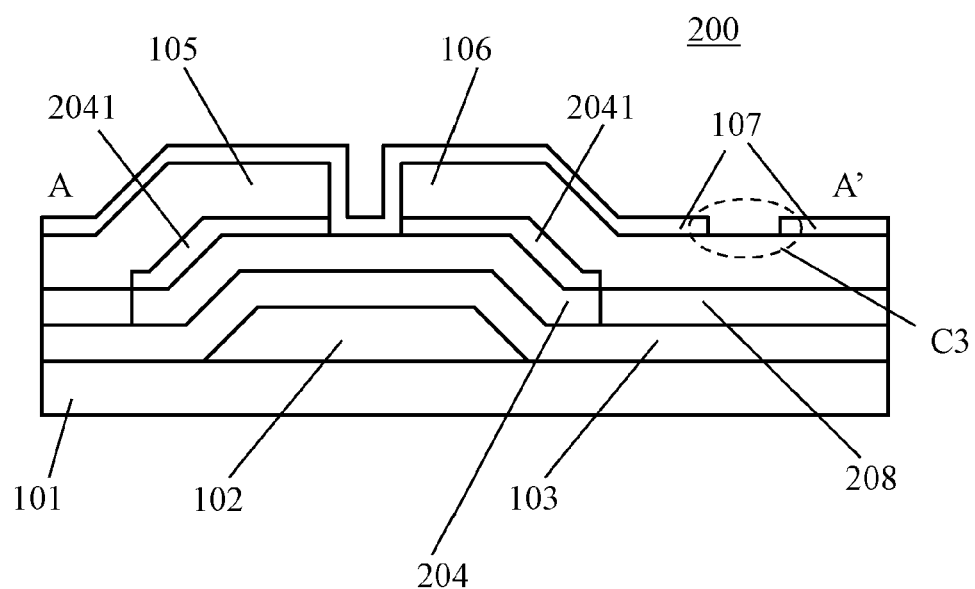
FIG. 4(k) is a partial section view illustrating the array substrate taken along the A-A' line of FIG. 4(j)
Figure 4L:
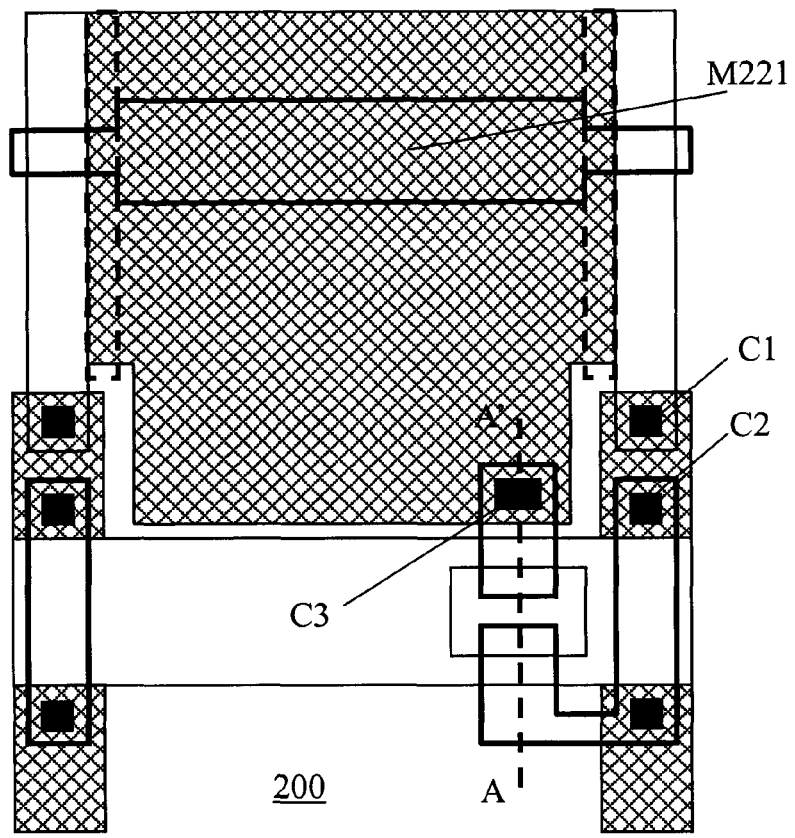
FIG. 4(l) is a partial plan view illustrating the array substrate after a fifth mask process.
Figure 4M:
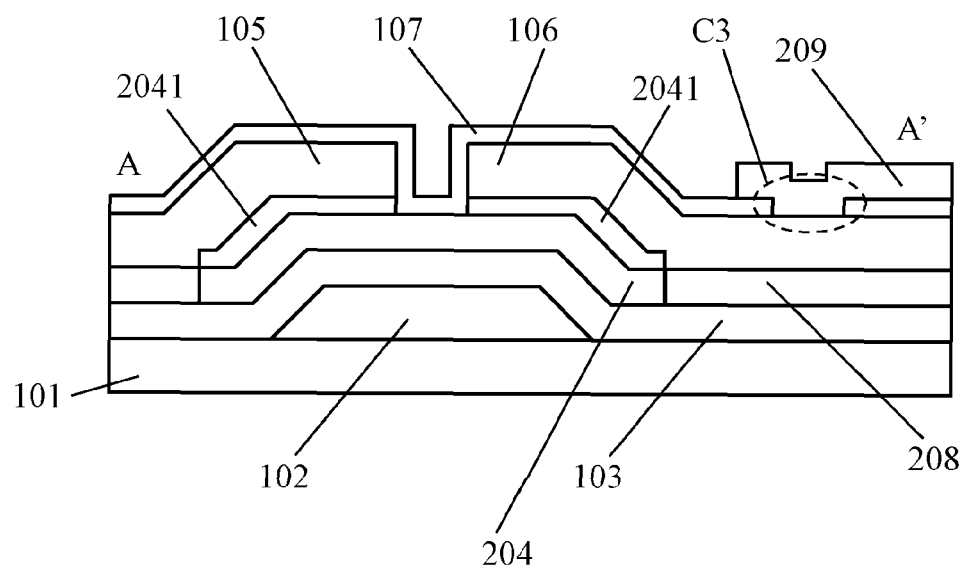
FIG. 4(m) is a partial section view illustrating the array substrate taken along the A-A' line of FIG. 4(l).

FIG. 4(l) is a partial plan view illustrating an array substrate 200 according to an embodiment of the invention, and FIG. 4(m) is a partial section view illustrating the array substrate 200 taken along the A-A' line of FIG. 4(l).

As shown in FIG. 4(m), the array substrate 200 according to an embodiment comprises: an insulator base 101; a gate electrode 102 of a TFT formed on the insulator base 101 by a first metal layer M1 as described hereafter; a gate insulating layer 103 overlying the gate electrode 102 and the insulator base 101; an amorphous silicon (a-Si:H) layer 204; a first ITO layer 208 positioned in the same layer as the amorphous silicon layer 204 and directly on the gate insulating layer 103; a doped amorphous silicon (n a-Si) layer 2041 directly on the amorphous silicon layer 204; a source electrode 105 and a drain electrode 106 of the TFT, which are formed by a second metal layer M2 as described later and positioned directly on the doped amorphous silicon layer 2041 and the first ITO layer 208; a passivation layer 107 directly on the second metal layer M2; and a second ITO layer 209 directly on the passivation layer 107 and forming the pixel electrode of the array substrate 200, the second ITO layer 209 being electrically connected with the drain electrode 106 of the TFT via a through-hole (also referred to as "the third through-hole") C3 in the passivation layer 107. Also as shown in FIG. 4(l), the second ITO layer 209 is electrically connected with a portion of the first metal layer M1 through the passivation layer 107 and the gate insulating layer 103 at a position of a through-hole (also referred to as "the first through-hole") C1 in the passivation layer 107, and electrically connected with a portion of the second metal layer M2 through the passivation layer 107 at a position of a through-hole (also referred to as "the second through-hole") C2 in the passivation layer 107, so that the portion of the first metal layer M1 and the portion of the second metal layer M2 collectively form the data line of the array substrate 200.

FIG. 4(a)-FIG. 4(m) illustratively show the respective steps of the method for manufacturing the array substrate 200 according to an embodiment of the invention.

A first mask process is carried out at first. On the insulator base 101 (typically, glass), the first metal layer M1 is formed, and then a first photoresist layer is formed. The first photoresist layer is exposed and developed with a first mask pattern to form a first photoresist pattern. The first metal layer is etched by using the first photoresist pattern as a mask and thus patterned. The patterned first metal layer M1 forms the gate electrode 102 of the TFT, the scan line SL connected with the gate electrode 102 of the TFT, and a first portion DL of the data line. Then the first photoresist layer is removed.

Subsequently, a second mask process is carried out as follows. On the array substrate 200, the gate insulating layer 103, the amorphous silicon layer 204, the doped amorphous silicon layer 2041 and a second photoresist layer PR2 are formed in this order. The second photoresist layer PR2 is exposed and then developed with a second mask pattern to form a second photoresist pattern. The doped amorphous silicon layer 2041 and the amorphous silicon layer 204 are etched by using the second photoresist pattern as a mask and thus patterned. As a result, a semiconductor layer having a predetermined pattern is formed in a predetermined region (as shown in, for example, FIGS. 4(a) and 4(b)) to serve as the semiconductor layer of the TFT. After the second mask process, the second photoresist layer PR2 is temporarily kept without being removed. FIG. 4(a) is a partial plan view illustrating the array substrate 200 after the second mask process, and FIG. 4(b) is a partial section view illustrating the array substrate 200 taken along the A-A' line of FIG. 4(a).

Then, a first layer of conductive transparent material 208 is formed on the array substrate 200. The conductive transparent material can be, for example, a conductive oxide such as ITO, indium zinc oxide (IZO) or the like. A layer of conductive transparent material is also referred to as "ITO layer" herein; it should be noted, however, that the material for such a layer is not limited to ITO. FIG. 4(c) is a partial plan view illustrating the array substrate 200 prior to a photoresist lift-off process, in which the portions covered by the first ITO layer are indicated with a broken line, and FIG. 4(d) is a partial section view illustrating the array substrate 200 taken along the A-A' line of FIG. 4(c). The photoresist lift-off process is then carried out to remove the portion of the first ITO layer 208 on the second photoresist layer PR2 and remove the second photoresist layer PR2. FIG. 4(e) is a partial section view illustrating the array substrate 200 after the photoresist lift-off process.

Subsequently, a third mask process is carried out. The second metal layer M2 and a third photoresist layer are formed on the insulator base 101, the semiconductor pattern and the pattern of the first ITO layer 208 of the array substrate subjected to the second mask process described above. The third photoresist layer is exposed and then developed with a third mask pattern to form a patterned third photoresist layer. In an embodiment, the third mask may be a half tone mask. Manufacturing and using of a half tone mask is disclosed in, for example, Chinese patent application publication CN1, 773,374A, which is incorporated herein by reference. The second metal layer M2 is etched by using the patterned third photoresist layer as a mask and thus patterned. The patterned second metal layer M2 generally comprises a first portion M21, a second portion M22 and a second portion M23. The first portion M21 will form the source electrode 104 and the drain electrode 106 of the TFT. Apart of the second portion M22 will form a portion of the common electrode of the array substrate 200. The third portion M23 will form a second portion DL' of the data line that is connected with the source electrode 105. Then, the portion of the first ITO layer 208 that is not covered by the pattern of the second metal layer M2 is removed. FIG. 4(f) shows a partial plan view of the array substrate 200 after the third mask process, and FIG. 4(g) shows a partial section view of the array substrate 200 taken along the A-A' line of FIG. 4(f).

Then the second metal layer M2 is partially removed. In case that a half tone mask is employed as the third mask, this step may be carried out by directly using the mask. Otherwise, the step may be carried out by adding a mask process. The second portion M22 of the second metal layer M2 is partially removed so that the underneath first ITO layer 208 corresponding thereto is uncovered (as shown by the shadowed portion in FIG. 4(h)). The remaining portion M221 of the second portion M22 of the second metal layer M2 and the uncovered portion of the first ITO layer 208 will serve as the common electrode of the array substrate 200. In an embodiment, the uncovered portion of the first ITO layer 208 may be positioned parallel to and adjacent to the first portion DL of the data line when viewed in a direction perpendicular to the surface of the array substrate. The first portion M21 of the second metal layer M2 is also partially removed to uncover the amorphous silicon layer 204 so that a TFT channel is formed at the corresponding area (as shown by the area "B" in FIG. 4(h)). Then the third photoresist layer is removed. FIG. 4(h) shows a partial plan view of the array substrate 200 after the TFT channel being formed and the third photoresist layer being removed, and FIG. 4(i) shows a partial section view of the array substrate 200 taken along the A-A' line of FIG. 4(h).

Subsequently, a fourth mask process is carried out. The passivation layer 107 and a fourth photoresist layer are formed on the array substrate 200 in this order. The fourth photoresist layer is exposed and then developed with a fourth mask pattern to form a patterned fourth photoresist layer. The passivation layer 107 is etched by using the patterned fourth photoresist layer as a mask and thus patterned to form a patterned passivation layer 107. The patterned passivation layer 107 comprises a plurality of through-holes C1, C2 and C3 therethrough. The first through-hole C1 causes the first part DL of the data line in the first metal layer M1 to be exposed at upper and lower sides of the scan line SL. The second through-hole C2 causes the second part DL' of the data line in the second metal layer M2, which part is connected with the source electrode 105, to be exposed at upper and lower sides of the scan line SL. The third through-hole C3 causes the drain electrode 106 of the TFT to be exposed partly at a position to be electrically connected with the pixel electrode. Finally, the fifth photoresist layer is removed. FIG. 4(j) is a partial plan view illustrating the array substrate 200 after the fourth mask process in which the locations of the through-holes are indicated by solid blocks, and FIG. 4(k) is a partial section view illustrating the array substrate 200 taken along the A-A' line of FIG. 4(j).

Then a fifth mask process is carried out. The second ITO layer 209 and a fifth photoresist layer are formed on the array substrate 200 in this order. The fifth photoresist layer is exposed and then developed with a fifth mask pattern to form a patterned fifth photoresist layer. The second ITO layer 209 is etched by using the patterned fifth photoresist layer as a mask and thus patterned. A portion of the second ITO layer 209 forms the pixel electrode and is electrically connected with the drain electrode 106 via the third through-hole C3. Another portion of the second ITO layer 209 (which may be referred to as a "connection portion") operates to electrically connect the first part DL of the data line in the first metal layer M1 with the second part DL' of the data line in the second metal layer M2 via the through-holes C1 and C2 so as to form a complete data line. Finally, the fifth photoresist layer is removed. FIG. 4(l) is a partial plan view illustrating the array substrate 200 after the fifth mask process, and FIG. 4(m) is a partial section view illustrating the array substrate 200 taken along the A-A' line of FIG. 4(l). In the plan view of FIG. 4(l), for clarity, the region where the second metal layer M2 resides is shown by bold solid lines; the common electrode of the array substrate 200 consists of an exposed portion of the first ITO layer 208 (which is shown in FIG. 4(*l*) by bold broken lines) and the above mentioned portion M221 of the second metal layer M2; and the region covered by the second ITO layer 209 is shown by the grid shadow.

The above method ends after the fifth mask process is completed.

According to a computer simulation, a pixel according to the embodiment of the invention has an aperture ratio 16% higher than that of a conventional pixel without variation in other aspects.

According to an embodiment of the invention, which also employs five mask processes, the second portion M221 of the second metal layer M2 acts as the common electrode. The second portion M221 of the second metal layer M2 and the first ITO layer 208 make contact and are hence electrically connected with each other, which are opposite to the pixel electrode in the second ITO layer 209 across the passivation layer 107 to form the storage capacitor. That is, the opaque first metal layer in the conventional technique is replaced partly with the first ITO layer 208 which is transparent (as shown in FIG. 4(*l*) by the bold broken lines). As a result, the aperture ratio of pixel is improved without reducing the capacitance of the storage capacitor according to an embodiment of the invention.

Figure 1:
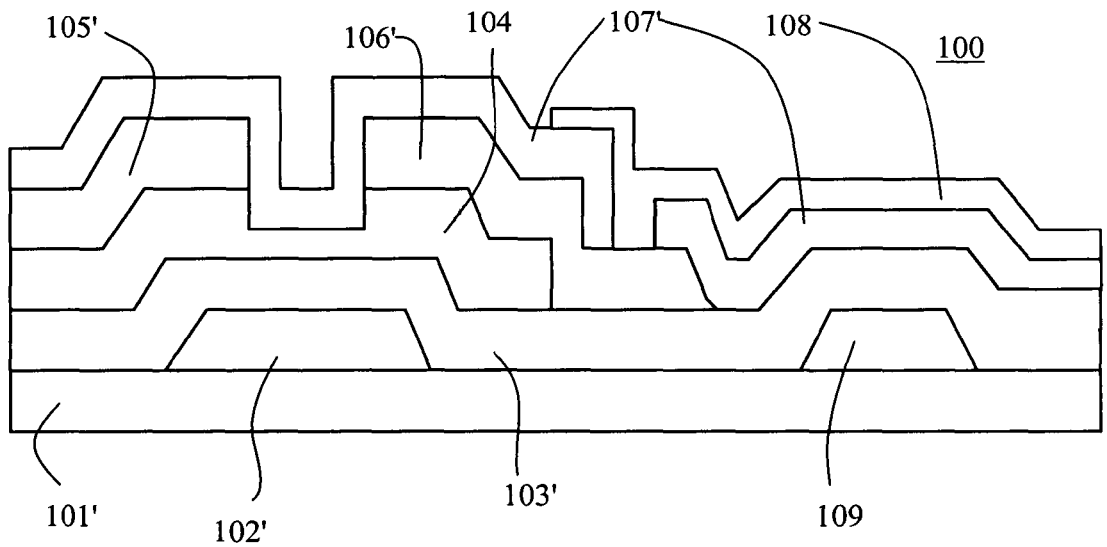
FIG. 1 is a cross section illustrating a structure of a conventional array substrate.
Figure 2:
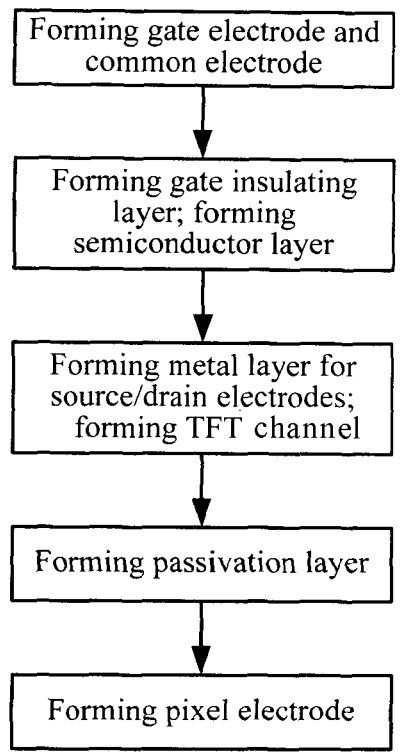
FIG. 2 is a flow chart illustrating a method for manufacturing the array substrate of FIG. 1.
Figure 3:
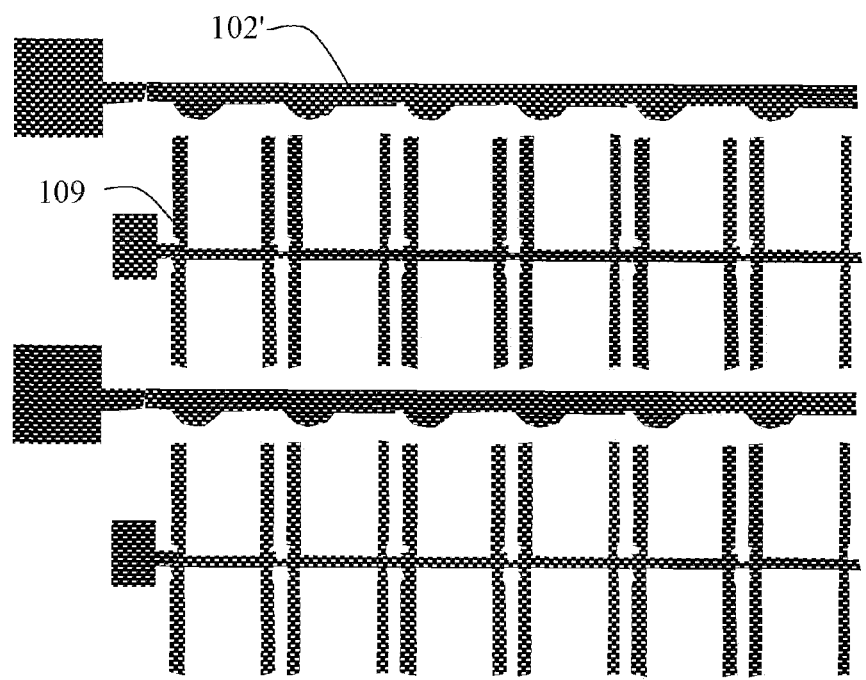
FIG. 3 is a plan view illustrating a pattern of the metal layer formed after the first mask process of the array substrate of FIG. 1.

Although the aperture ratio may be improved by replacing the opaque metal layer with the transparent first ITO layer 208, the ITO material usually has a higher resistivity than that of typical metal conductors. Therefore, if the first ITO layer 208 occupies a too large a portion of area, signal transmission delay and image distortion may occur. If the ITO material completely takes the place of the metal material in the common electrode, the signal transmission delay and image distortion would be increased and even hinder the operation of the array substrate. In consideration of this, the area in the common electrode that is occupied by the first ITO layer 208 may be, for example, in a range of about 20%-about 70%. In the conventional array substrate shown in FIGS. 1-3, capacitive coupling of the data line to the pixel electrode cannot be shielded. In contrast, in an embodiment of the invention, the first ITO layer 208, which is conductive, is positioned between the data line and the pixel electrode, which may at least partially shield the capacitive coupling of the first portion DL of the data line to the pixel electrode (the second ITO layer 209).

Although the invention has been described in detail by using the specific embodiment with reference to the drawings, the description is merely illustrative. The invention may take other modified or alternative forms without departing from the spirit thereof. The scope of the invention is defined not by the specific embodiments described above, but by the appended claims.

What is claimed is:

1. A TFT array substrate having data lines and scan lines, a TFT and a storage capacitor, the data lines and the scan lines being arranged to intersect one another to define pixel regions, the storage capacitor comprising a pixel electrode, a common electrode and an insulator disposed therebetween, the array substrate comprising:

an insulator base;
a first metal layer on the insulator base, a first portion of the first metal layer forming a gate electrode of the TFT and the scan line electrically connected with the gate electrode;
a gate insulating layer overlying the first metal layer and the insulator base;
an amorphous silicon layer and a first layer of conductive transparent material (208) both positioned on the gate insulating layer;
a doped amorphous silicon layer positioned on the amorphous silicon layer and forming a semiconductor layer of the TFT with the amorphous silicon layer collectively;
a second metal layer positioned on the doped amorphous silicon layer and the first layer of conductive transparent material, a first portion of the second metal layer forming a source electrode and a drain electrode of the TFT, the source electrode being electrically connected with the data line;
a passivation layer on the second metal layer acting as the insulator; and
a second layer of conductive transparent material on the passivation layer, a first portion of the second layer of conductive transparent material forming the pixel electrode, the pixel electrode being electrically connected with the drain electrode,
wherein the first layer of conductive transparent material forms a portion of the common electrode.

2. The array substrate according to claim 1, wherein a second portion of the second metal layer forms another portion of the common electrode.

3. The array substrate according to claim 1, wherein
the first metal layer comprises a first portion of the data line;
the second metal layer comprises a third portion forming a second portion of the data line; and
the second layer of conductive transparent material comprises a connection portion by which the first portion of the data line and the second portion of the data line are electrically connected.

4. The array substrate according to claim 3, wherein the passivation layer comprises a first through-hole and a second through-hole at the first portion of the data line and the second portion of the data line respectively, the connection portion being electrically connected with the first portion of the data line through the passivation layer and the gate insulating layer at the first through-hole and electrically connected with the second portion of the data line through the passivation layer at the second through-hole.

5. The array substrate according to claim 1, wherein the first layer of conductive transparent material that forms the portion of the common electrode is positioned parallel to and adjacent to the data line when viewed in a direction perpendicular to the surface of the array substrate.

6. The array substrate according to claim 1, wherein the first layer of conductive transparent material that forms the portion of the common electrode occupies about 20%-about 70% of an area of the common electrode.

* * * * *